United States Patent [19]

Foroni et al.

[11] Patent Number: 4,725,810
[45] Date of Patent: Feb. 16, 1988

[54] METHOD OF MAKING AN IMPLANTED RESISTOR, AND RESISTOR OBTAINED THEREBY

[75] Inventors: Mario Foroni, Valeggio Sul Mincio; Paolo Ferrari, Gallarate; Franco Bertotti, Milan, all of Italy

[73] Assignee: SGS Microelettronica S.p.A., Catania, Italy

[21] Appl. No.: 876,964

[22] Filed: Jun. 20, 1986

[30] Foreign Application Priority Data

Jul. 4, 1985 [IT] Italy .................. 21433 A/85

[51] Int. Cl.⁴ .................. H01C 1/02; H01C 17/00; B05D 5/12; B44C 1/22
[52] U.S. Cl. .................. 338/226; 29/610 R; 156/653; 156/657; 338/308; 427/103
[58] Field of Search .............. 29/610 R, 610 SQ, 620; 338/226, 308; 427/85, 86, 103; 148/1.5, 187; 156/653, 657, 659.1

[56] References Cited

U.S. PATENT DOCUMENTS

| | | | |
|---|---|---|---|
| 3,570,114 | 3/1971 | Bean et al. | 29/620 X |
| 4,167,804 | 9/1979 | Greenstein | 29/610 R |
| 4,326,213 | 4/1982 | Shirai et al. | 357/51 |
| 4,367,580 | 1/1983 | Guterman | 29/577 C |
| 4,467,312 | 8/1984 | Komatsu | 29/577 C |

*Primary Examiner*—William A. Powell
*Attorney, Agent, or Firm*—Guido Modiano; Albert Josif

[57] ABSTRACT

This method of making an implanted resistor comprises the steps of implanting the resistor with ordinary techniques and deposition over the implanted resistor of a polysilicon layer having a set thickness and fully covering the resistor. Thus, the resulting resistor is unaffected by any subsequent thermal treatments and its value remains constant irrespective of any high potential metal layers or connections crossing it. The method affords in particular resistive values of the order of 1 kOhms/square.

7 Claims, 1 Drawing Figure

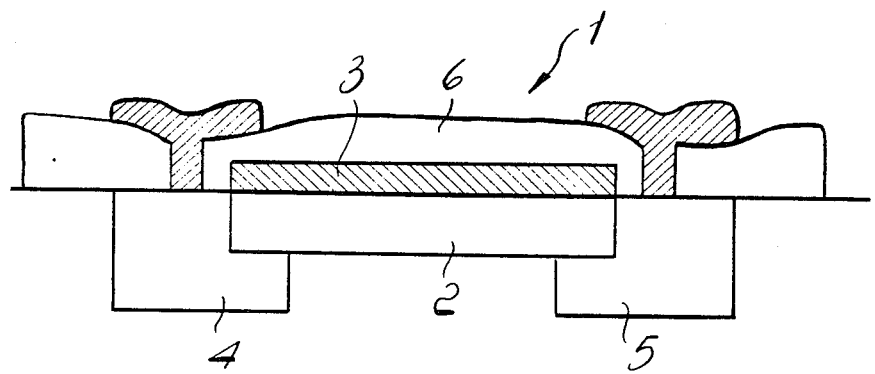

METHOD OF MAKING AN IMPLANTED RESISTOR, AND RESISTOR OBTAINED THEREBY

BACKGROUND OF THE INVENTION

This invention relates to a method of making an implanted resistor, as well as to a resistor obtained with that method.

As is known, to make resistive elements in a semiconductor substrate or chip, in particular high Ohmic value resistors, for use as integrated resistive circuit components to be circuitally connected, for example, to such active components as transistors, several techniques are currently employed the most common of which are the making of such resistors following diffusion of the emitter resions, that is on completion of the process and their making prior to deposition and diffusion of the base and emitter regions.

In the former prior method, the resistor is generally obtained by phototreatment on the field oxide, which has a significant thickness. This fact may give rise to the problem of interruptions of any metal layers or connections (hereafter called "metals") crossing the resistor; in addition, if the metal crossing the resistor is at a high potential, undesired variations in the Ohmic value of the resistor may also occur.

Vice versa, with the latter prior method mentioned above, the resistors are made, as mentioned, after the deposition and diffusion of the base and emitter regions. In this case, the substantial drawback is encountered that the Ohmic value of the resistance depends on such thermal treatments as successive oxidations.

SUMMARY OF THE INVENTION

Accordingly, the aim of this invention is to provide a method of making an implanted resistor whereby the drawbacks affecting prior methods can be obviated.

Within the above aim, it is a primary object of this invention to provide a method as indicated which affords high value and minimal encumbrance resistors which do not cause interruptions of any metal crossing the resistors themselves, and which are unaffected by high potential metal which could change their values.

Another object of this invention is to provide a method as indicated, which allows the making of resistors independently of such treatments as successive oxidations of the semiconductor body.

A not least object of this invention is to provide a method as indicated, which includes a minimum number of steps and can be implemented in an extremely economical way utilizing conventional techniques and equipment.

According to the invention, the above-mentioned aim and objects are achieved, along with other objects to become apparent hereinafter, by a method of making an implanted resistor, in particular an implanted high Ohmic value resistor, comprising in sequence a first step of implanting, with known techniques, a high resistive value zone in a semiconductor region, said high resistive value zone having set width and length, a second step of depositing a layer of polycrystalline silicon, having a set thickness, thereby completely covering said high resistive value zone, and at least one third step of deposition and diffusion of further zones having set conductivities and dopings in said semiconductor region.

BRIEF DESCRIPTION OF THE DRAWING

Further features and advantages of the invention will become apparent from the following detailed description, with reference to the single FIGURE drawing herein, which shows in cross-section and to an enlarged scale a high value resistor implanted in a semiconductor chip according to the invention.

DESCRIPTION OF THE INVENTION

With more specific reference to the cited drawing FIGURE, a method of making a minimum encumbrance high Ohmic value resistor, implanted in a semiconductor substrate, according to this invention, comprises a first step of implanting, in a semiconductor substrate generally designated with the reference numeral 1, with known techniques, a high resistive value zone, e.g. of the P type, and generally designated with the reference numeral 2, that zone having width and length which are set on the basis of the resistance value sought. In particular the high resistive value zone can be obtained by boron implantation over the surface of the semiconductor chip (substrate 1) through a mask obtained with a photolithographic step.

According to the invention, after implanting that resistive zone 2, a polycrystalline silicon 3 is deposited, which completely covers the resistive zone 2. The thickness of the polysilicon layer 3 is also set to meet specific requirements. From the FIGURE it may be seen that the resistive zone 2 has, in the proximities of its ends, two zones 4 and 5, for example also of the P type, which are adapted to define the terminals for the resistive element 2 formed. Subsequently, in a further step of the method, base and emitter zones may be formed, for example, which are not described in detail but may have set dopings and conductivities.

Thus, the resulting resistor 2 is in particular independent of any successive oxidation treatments and cannot be affected therefrom, since oxidation is effected over the polysilicon. An upper insulating layer of silicon dioxide has been designated in the FIGURE with the reference numeral 6.

As the skilled one will appreciate, the polysilicon will act as a screen for any high potential metal crossing the resistor. Furthermore, the inventive method solves the problem of possible crackings of any metal crossing the resistor, which represented a significant drawback of prior art, as mentioned hereinabove.

It has been found in practice that, thanks to the inventive method, it is possible to obtain resistive elements of high value, e.g. 1 kOhms/square, which value remains substantially constant, despite the cited external influences.

It may be appreciated from the foregoing that the invention fully achieves the objects set forth.

In particular, the method according to the invention, even though generally falling within the second class of the methods previously indicated, that is where the resistor is formed before completion of the devices integrated in the chip substrate, for example, prior to the base and emitter deposition and diffusion, deviates from that class of methods in that it provides a specific polysilicon deposition step that affords minimum encumbrance high value implanted resistors independent of successive treatments, and which have all the advantages previously mentioned.

While the invention has been described with reference to a specific embodiment thereof, it is understood that it is susceptible to modifications and changes within the scope of the inventive concept. As an example, the method may be readily extended to the simultaneous making of plural resistors having different high Ohmic values.

We claim:

1. A semiconductor resistor, in particular a high Ohmic semiconductor resistor, comprising:
   a semiconductor substrate having a surface area,
   a semiconductor implanted resistor region extending within said semiconductor substrate along said surface area,
   a polycrystalline silicon layer extending on said surface area of said semiconductor substrate at least over said semiconductor implanted resistor region.

2. A semiconductor resistor according to claim 1, further comprising a protective oxide layer covering said polycrystalline silicon layer.

3. A semiconductor resistor, in particular a high Ohmic semiconductor resistor, comprising:
   a semiconductor substrate having a surface area,
   a semiconductor implanted resistor region extending within said semiconductor substrate along said surface area, said implanted resistor region having set length and width,
   a polycrystalline silicon layer extending on said surface area of said semiconductor substrate and completely covering at least said semiconductor implanted resistor region.

4. A semiconductor resistor according to claim 3, further comprising a protective oxide layer completely covering said polycrystalline silicon layer.

5. A semiconductor resistor according to claim 3, wherein said semiconductor implanted resistor region has a sheet resistance of 1 kOhm/square.

6. A method of making semiconductor resistors, in particular high ohmic semiconductor resistors, comprising the steps of:
   implanting a semiconductor resistor region in a semiconductor substrate according to a preset pattern,
   depositing a layer of polycrystalline silicon on a surface area of said semiconductor substrate, said polycrystalline silicon layer covering said surface area at least at said semiconductor resistor region.

7. A method according to claim 6, further comprising growing an oxide layer over said polycrystalline silicon layer.

* * * * *